United States Patent [19]
Kenney

[11] Patent Number: 5,334,800
[45] Date of Patent: Aug. 2, 1994

[54] FLEXIBLE SHIELDED CIRCUIT BOARD

[75] Inventor: Stephen O. Kenney, Haverhill, Mass.

[73] Assignee: Parlex Corporation, Methuen, Mass.

[21] Appl. No.: 95,287

[22] Filed: Jul. 21, 1993

[51] Int. Cl.⁵ .............................................. H05K 9/00
[52] U.S. Cl. .............................. 174/35 R; 174/35 MS; 361/818
[58] Field of Search ............... 174/35 R, 35 MS, 52.4; 361/748, 749, 750, 751, 762, 800, 816, 818; 428/105, 109; 66/202

[56] References Cited

U.S. PATENT DOCUMENTS

| | | |
|---|---|---|
| 3,923,364 | 12/1975 | Shapiro et al. |
| 4,408,255 | 10/1983 | Adkins ...................... 174/35 MS X |
| 4,689,262 | 8/1987 | Bloom ................... 428/201 |
| 4,769,270 | 9/1988 | Nagamatsu et al. ................ 428/131 |
| 4,825,090 | 4/1989 | Grabis ................. 250/515.1 |
| 4,845,313 | 7/1989 | Endoh et al. ...................... 174/68.5 |
| 4,857,119 | 8/1989 | Karst et al. ...................... 428/596 X |
| 4,885,431 | 12/1989 | Kawakami et al. ................ 174/68.5 |
| 4,973,799 | 11/1990 | Soma et al. .................. 174/260 |
| 4,978,812 | 12/1990 | Akeyoshi et al. ............. 174/35 MS |
| 5,012,041 | 4/1991 | Sims et al. .................... 174/35 MS |
| 5,110,651 | 5/1992 | Massard et al. ...................... 428/105 |
| 5,112,648 | 5/1992 | Okonogi et al. ...................... 427/96 |
| 5,177,324 | 1/1993 | Carr et al. ........................... 174/35 R |
| 5,195,243 | 3/1993 | Junod ................................ 29/897.32 |
| 5,293,004 | 3/1994 | Kawakami et al. ................. 174/250 |
| 5,296,651 | 3/1994 | Gurrie et al. ...................... 174/254 |

Primary Examiner—Leo P. Picard
Assistant Examiner—Christopher Horgan
Attorney, Agent, or Firm—Weingarten, Schurgin, Gagnebin & Hayes

[57] ABSTRACT

A flexible circuit board providing the dual benefits of flexibility and shielding against incidental radiation. The flexible, shielded circuit board includes a number of electrical conductors disposed in a substrate, substantially parallel to opposing surfaces of the substrate. Electrical shield layers in the form of a mesh or grid are disposed on the substrate surfaces and are preferably formed by screen printing a conductive layer on each side of the substrate. A repeating pattern of shield conductors, shield conductor vertices, and voids in the shield layer through which the substrate is exposed is thus created on either side of the substrate.

9 Claims, 3 Drawing Sheets

FLEXIBLE SHIELDED CIRCUIT BOARD

FIELD OF THE INVENTION

This invention relates to circuit boards, and more particularly to flexible circuit boards having non-continuous shield layers on opposing circuit board surfaces.

BACKGROUND OF THE INVENTION

Circuit boards having a flexible portion are known in the art and are particularly useful in various applications where flexing or folding of the circuit board is a requirement. Further, circuit boards having shield layers on opposing sides of the circuit board are known and find important use in applications where prevention of incidental radiation from the board and shielding of the board from external noise is required.

Providing one or two continuous shielding layers on surfaces of a circuit board necessarily limits or eliminates the board's ability to flex. This is particularly true where shield layers are deposited or formed directly on the circuit board substrate surfaces. Stress between the layers during flexing can lead to severance of the bond between shield layers and the circuit board, and a resultant decrease in shield efficiency and board performance.

The prior art fails to meet the demand for a truly flexible circuit board having shielding sufficient to meet strict incidental radiation specifications, such as those of the Federal Communications Commission (FCC) and International Special Committee on Radio Interference (CISPR/VDE).

SUMMARY OF THE INVENTION

A low cost, easy to manufacture circuit board providing the dual benefits of flexibility and shielding against incidental radiation is disclosed. The flexible, shielded circuit board includes a number of electrical conductors disposed in a substrate, substantially parallel to opposing surfaces of the substrate. Electrical shield layers in the form of a mesh or grid are disposed on the substrate surfaces and are preferably formed by screen printing a conductive layer on each side of the substrate. In one preferred embodiment, the mesh shield is a screened conductive silver epoxy. In another embodiment, one shield layer is etched copper on a second side of the substrate. A repeating pattern of shield conductors, shield conductor vertices, and voids in the shield layer through which the substrate is exposed is thus created on either side of the substrate.

In one embodiment, stripline geometry is employed in which signal conductors and ground conductors are disposed in the substrate between the mesh shield layers. The ground conductors are connected to the shields at selected intervals to provide intended shielding.

The shield layers are oriented on the substrate in offset relation to position the voids of one layer over conductor vertices of the opposing layer. Further, each signal conductor within the substrate is proximate to only one shield conductor vertex. In order to provide shielding along lateral edges of the substrate, a first and last signal conductor disposed along the lateral edges of the substrate are in electrical connection to both shield layers.

By forming shield layers having approximately 40% to 60% voids in area, and by employing a screened silver epoxy or other suitable screened material as at least one shield layer conductor, a highly flexible circuit board is produced which prevents emission from incidental radiation to levels meeting the stringent requirements of the FCC and CISPR/VDE.

Silver epoxy is used as the material for at least one of the shield layers in order to reduce overall cost of production and for ease of processing. Silver epoxy can be screen printed directly on the dielectric material and requires curing at relatively low temperatures. Further, the use of silver epoxy in at least one shield layer reduces the cost of etching copper shield layers on both sides of the substrate.

DESCRIPTION OF THE DRAWINGS

This invention is pointed out with particularity in the appended claims. The above and further advantages of this invention may be better understood by referring to the following description taken in conjunction with the accompanying drawings, in which:

DETAILED DESCRIPTION OF THE INVENTION

Figure 1:
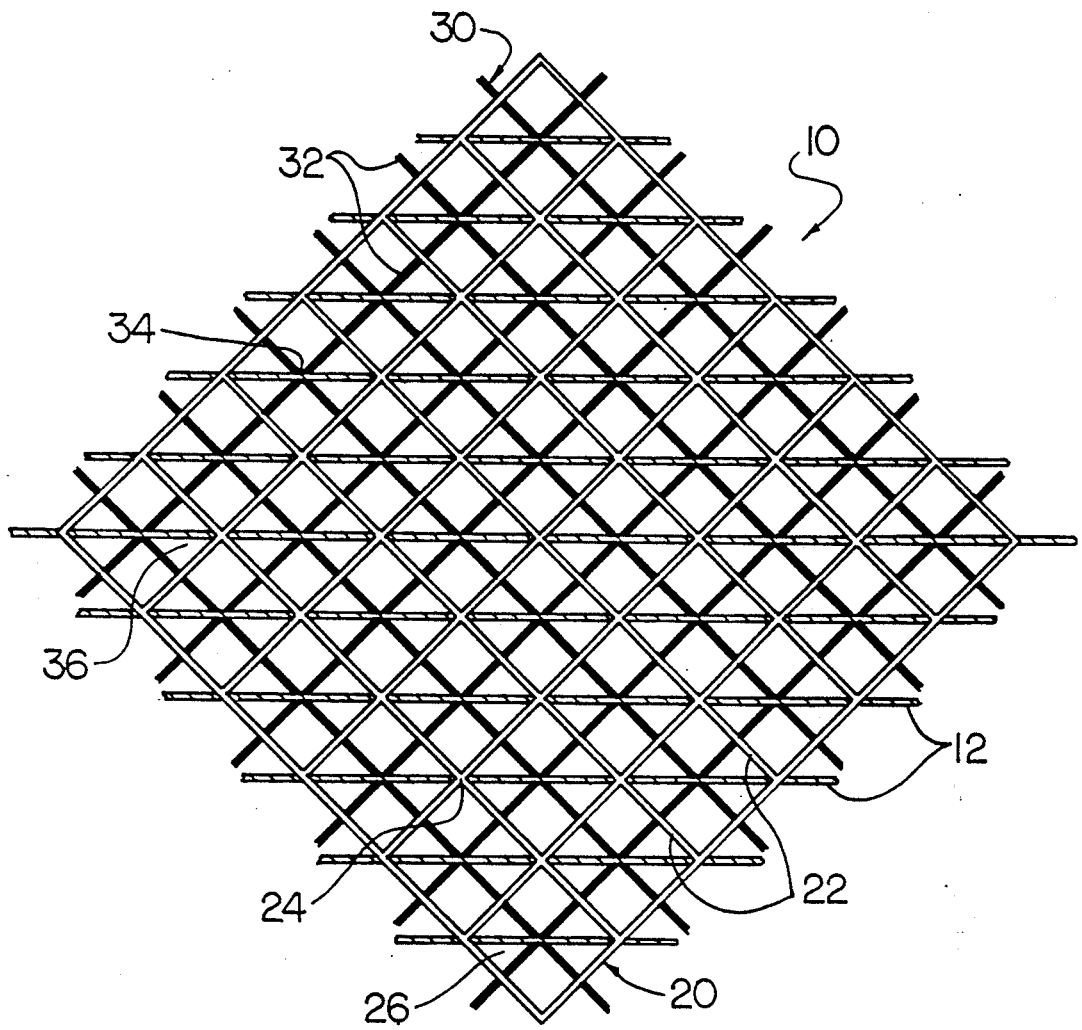
FIG. 1 is a partial top schematic view of the flexible, shielded circuit board according to the invention.
Figure 2:
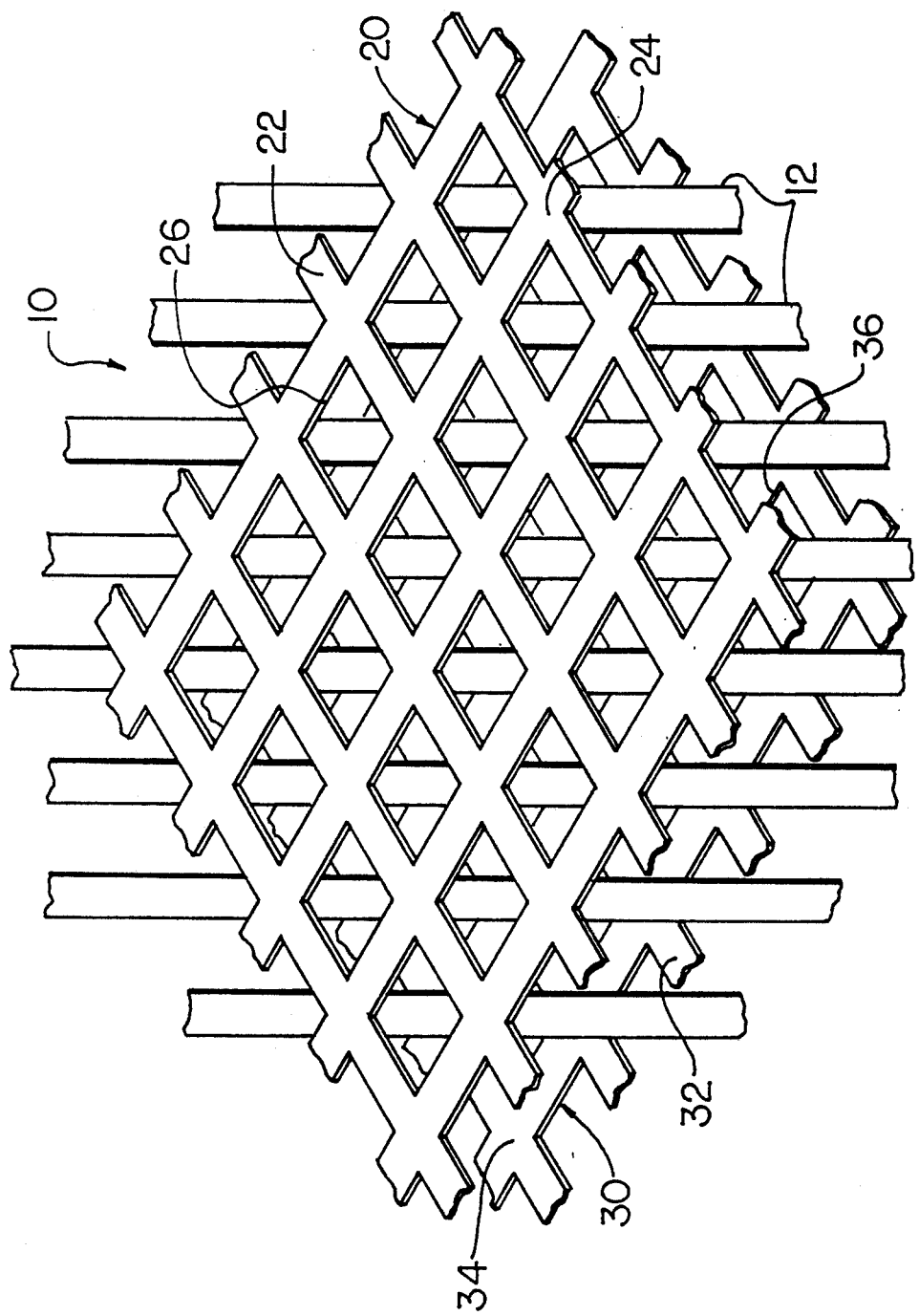
FIG. 2 is a partial isometric view of the circuit board of FIG. 1.

The flexible shielded circuit board 10 according to the invention is shown in FIGS. 1 and 2 and includes a plurality of electrical signal conductors 12 disposed under a first mesh or grid-shaped electrical shield layer 20, and over a second mesh or grid-shaped electrical shield layer 30. The conductor widths and spacings are not drawn to scale. In one embodiment, the entire flexible shielded circuit board 10, including signal conductors 10 and shield layers 20, 30, is encased in a dielectric material, such as polyimide.

Each of the first and second shield layers 20, 30 is comprised of respective shield conductors 22, 32 which intersect at respective shield vertices 24, 34. Shield voids 26 where no shield material of shield layer 20 is present are defined by the conductors 22. Similarly, shield voids 36 are provided in shield layer 30 as defined by conductors 32.

The relative positioning of the first and second shield layers 20 and 30 is such that each first shield vertex 24 is over a second shield void 36, and each second shield vertex 34 is under a first shield void 26. Further, the electrical signal conductors 12 pass between shield voids 26, 36 and shield vertices 24, 34. In this configuration, the flexible shielded circuit board 10 will have no more than two superimposed conductors (e.g. shield 22 over shield 32, shield 22 over signal 12, or signal 12 over shield 32) at any one location. In addition to improving the flexional characteristics of the shielded circuit board 10, limited conductor overlap minimizes circuit board thickness. In a further embodiment of the present invention, additional layers of signal conductors and associated shield layers (not illustrated) can be superimposed on the flexible shielded circuit board 10.

The relative widths and spacings of the shield conductors 22, 32 and the signal conductors 12 is selected to achieve the intended electrical performance specifications.

Figure 3:
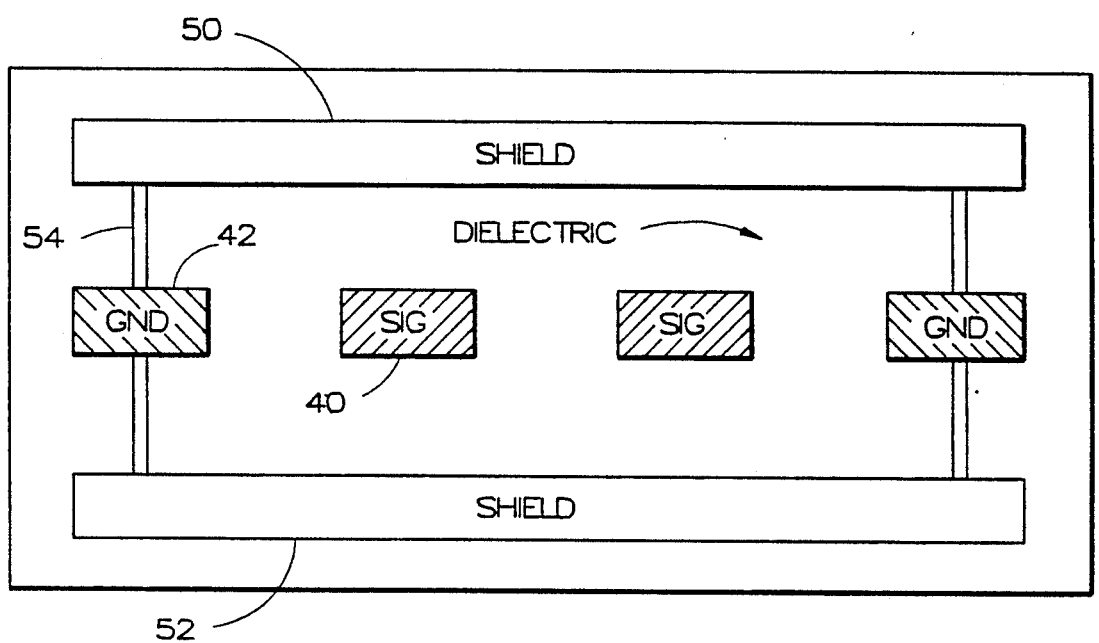
FIG. 3 is a schematic elevation view of a stripline circuit board embedding the invention.

FIG. 3 shows a stripline circuit board in accordance with the invention. Signal conductors 40 and ground conductors 42 are disposed in spaced relation in a common plane in the circuit board substrate between the mesh shields 50 and 52. In the illustrated version two signal conductors 40 are disposed between outer ground conductors 42. The ground conductors are connected to the shields at selected intervals by through conductors 54. The through conductors 54 can be formed by allowing liquid or semi-fluid conductor material to flow through cavities in the dielectric, or by the use of plated through holes.

For a 50 ohm impedance stripline with the configuration of FIG. 3, typical dimensions are as follows. The signal and ground conductors 40 and 42 have a width of 0.007 inch and a thickness of 0.0012 inch. The spacing between the shields is 0.006 inch. The shield layers have a line width of 0.012 inch, a thickness of 0.0005 inch with about 60% open or void area.

Having shown a preferred embodiment, those skilled in the art will realize many variations are possible which will still be within the scope and spirit of the claimed invention. Therefore it is the intention to limit the invention only as indicated by the scope of the claims.

What is claimed is:

1. A flexible, shielded circuit board comprising:
   a substrate having first and second opposing substantially planar surfaces and one or more conductors disposed in the substrate; and
   first and second shield layers comprised of electrically conductive material respectively disposed on said first and second planar surfaces, said first and second shield layers each having a mesh pattern of voids and conductive regions, said voids being defined by said conductive regions;
   the mesh pattern of said first shield layer being offset from the mesh pattern of said second shield layer.

2. The circuit board of claim 1 wherein at least one of said first and second shield layers include screen printed conductive silver epoxy.

3. The circuit board of claim 1 wherein said substrate layer includes a homogenous material forming a substantially uniform substrate layer.

4. The circuit board of claim 3 wherein said homogenous material forms said substrate layer and encases said shield layers.

5. The flexible circuit of claim 1 wherein said conductors include a plurality of conductors, and wherein the first and last ones of said plurality of conductors are electrically connected to said first and second shield layers.

6. The flexible circuit of claim 1 wherein said mesh pattern includes a regularly spaced of generally square voids spaced equidistantly in the planes of the shield layers.

7. The flexible circuit of claim 6 wherein said regularly spaced pattern of said first and second shield layers is about 40% to 60% voids in surface area.

8. The flexible circuit of claim 1 wherein said voids in said first shield layer are generally vertically aligned with vertices in the conductive regions of said second shield layer, and said voids in said second shield layer are generally vertically aligned with vertices in the conductive regions of said first shield layer.

9. The flexible circuit of claim 8 wherein each of said conductors is generally vertically aligned with the vertices and voids in the first and second shield layers.

* * * * *